United States Patent [19]
Jiang

[11] Patent Number: 5,309,084
[45] Date of Patent: May 3, 1994

[54] ELECTRONIC SWITCH WITH ON/OFF FADING

[76] Inventor: Zigang Jiang, No. 516 Building 951, Zhongguancun, Beijing 100080, China

[21] Appl. No.: 909,070
[22] Filed: Jul. 2, 1992
[30] Foreign Application Priority Data

Jul. 4, 1991 [CN] China ............... 91106745.0

[51] Int. Cl.$^5$ ............... G05F 1/56
[52] U.S. Cl. ............... 323/321; 323/238; 323/239; 323/242; 323/324; 323/326
[58] Field of Search ............... 323/237, 238, 239, 242, 323/320, 321, 324, 326, 327

[56] References Cited

U.S. PATENT DOCUMENTS

| | | | |
|---|---|---|---|
| 3,621,373 | 11/1971 | Mitchell | 323/243 |
| 3,898,516 | 8/1975 | Nakasone | 323/238 |
| 4,006,368 | 2/1977 | Ichikawa | 323/327 |
| 4,008,416 | 2/1977 | Nakasone | 323/321 |
| 4,082,961 | 4/1978 | Genuit | 307/141 |
| 4,152,607 | 5/1979 | Nakasone | 307/252 B |
| 4,152,608 | 5/1979 | Nakasone et al. | 307/252 B |
| 4,328,459 | 5/1982 | McLeod | 323/321 |
| 4,360,743 | 11/1982 | Stokes | 307/252 B |
| 4,423,478 | 12/1983 | Bullock et al. | 323/238 |
| 4,680,536 | 7/1987 | Roszel | 323/324 |
| 4,697,229 | 9/1987 | Davy et al. | 323/238 |
| 5,070,229 | 12/1991 | Takatsuka et al. | 323/238 |

*Primary Examiner*—Jeffrey L. Sterrett
*Attorney, Agent, or Firm*—Majestic, Parsons, Siebert & Hsue

[57] ABSTRACT

The present invention provides a electronic switch suitable for fading on/off control of electrical equipment like lamps and motors. The main circuit comprises a rectifier bridge circuit and a thyristor. A control circuit includes a fast discharging synchronic integrator and a trigger pulse integrator, the former acts as a pulse phase shifter to provide a self-adapting magnitude variable sawtooth waveform, while the latter acts as a dynamic phase variation memory so as to provide a variable reference for comparison. Trigger pulses which are feed back via the main circuit causes the synchronic integrator to fast discharge. If a control switch is closed, the voltage on the integral capacitor and the trigger angle decreases gradually to produce the fade on. In the fade off process, the conditions are just the opposite. Fading on/off time can be independently set.

7 Claims, 1 Drawing Sheet

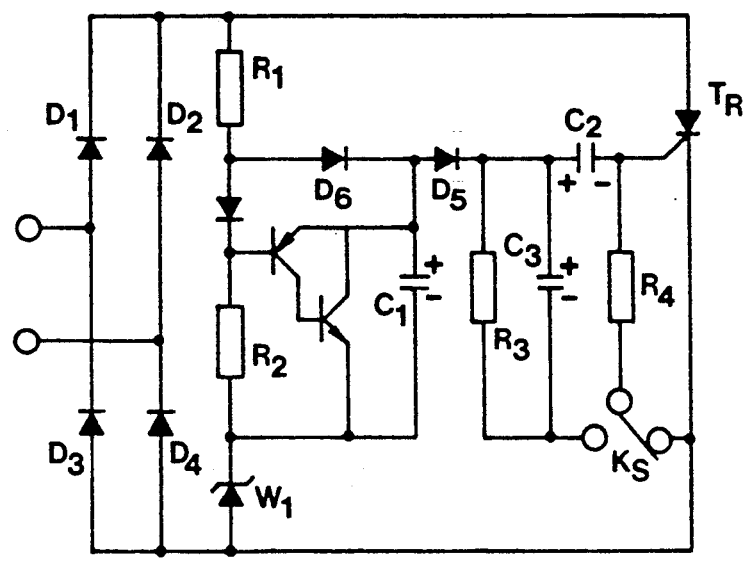
FIG._1.

ELECTRONIC SWITCH WITH ON/OFF FADING

BACKGROUND OF THE INVENTION

The present invention relates to a fading on and fading off electronic switch suitable for natural light-simulated control of illumination and fading on and off reduced voltage on/off control of electrical heaters. The fading process of the switch go on automatically after on/off guiding operation.

In the prior art, electrical devices like illumination apparatus, motor, and electrical heater are all turned on and off suddenly at the whole voltage, and their transition processes are determined by the physical inertia parameters of the devices themselves and can not be controlled or adjusted. In many cases, it can not meet the demand of the people, or even cause damage to users. In some large or special equipment that needs reduction start or reduction shut down, an equipment which adjusts a series-connected adjustable resistance apparatus is often used to control the on/off transition process. In some more critical applications, analog computing apparatus comprising the combination of open loop or close loop proportional integral, differential or inertia stages or even digital program-controlled apparatus or special industry-control computers are used to automatically control various transition processes including start and shut down. However, these apparatus or computer are very expensive, and go beyond the category of fading on/off switch. As to illumination control, specially designed fading on/off illumination control equipments including voltage regulator and transistor continuous light regulator are used in some high-grade theatres. The operating process of these equipments all belong to man-machine close-loop real-time operation and must be carried out in coordination with the on/off operations of switches. Among the continuous light regulated apparatus for home use, a single point touch switch is developed recently. This switch detects the touch operation by using body induction signal, and controls the trigger of a thyristor by phase regulation performed by built-in IC circuits. Trigger angle will be held when people stop touching the apparatus, and instantaneous touch will cause the on/off states to exchange. Appearently, this also belongs to man-machine close loop real time operation. Up to now, commercially available light-adjustable lamps are also products of this category. To sum up, no convenient and cheap switch which fades on/off automatically when it is turned on/off is provided in the prior art.

OBJECTS OF THE INVENTION

The object of the present invention is to provide a convenient and cheap electronic switch with fading on/off illumination control so as to simulate the fading on/off transition characteristics of the sunlight, and for controlling equipment like motor and electrical appliances so as to provide fading on/off reduction start and shut down functions, wherein the fading process goes on automatically after on/off guiding operation.

SUMMARY OF THE INVENTION

The electronic switch with on/off fading according to the present application comprises a main branch including a bridge rectifier and a thyristor, and a triggering branch which has a trigger pulse integrator including a series connection branch of a diode and a capacitor. Said trigger pulse integrator is connected between the anode and control terminal of the thyristor. A discharge control branch comprising operational connection points (of hole type or non hold type) and a parallel network series-connected with each other is connected parallel between the two sides of the integral capacity. The parallel network consists a resistor and a capacity connected in parallel.

When the switch according to the present application is used, the two AC lines are connected to two AC input of the bridge rectifier respectively. The on and off processes are completed automatically after the operational connection points are operated. When this switch is turned off, the integral capacity of the trigger pulse integrator is discharged to a maximum voltage value, and the diode in the branch is turned off because of reverse biasing. As a result, the thyristor is kept in cut-off state because no trigger current flows. Once the normal open connection points are closed, the integral capacity begins to discharge via a discharging resistor and its voltage decreases gradually. In each period of 10 ms (reciprocal of the base frequency of 100 Hz outputted by the bridge rectifier), the diode is biased forwardly and is conductive so as to produce a current pulse to trigger the thyrister when the difference between the instantaneous pulse voltage and the voltage of the integral capacity is positive. After the thyristor is triggered, the anode-cathode voltage drop of the thyristor is reduced to saturation voltage and the diode resumes reverse biasing immediately. As the capacity discharge gradually, the time at which the difference between the instantaneous pulse voltage and the voltage of the integral capacity becames positive preact step by step, and the average current flowing in the main branch become larger and larger until a minimum value is reached. This is the fading onprocess.

When the normal close connection points are opened, discharge branch of the integral capacity is disconnected, the integral capacity is charged by a trigger pulse every 10 ms. As contrasted with the switch in fading process, the voltage of the integral capacity increases gradually, and the time at which the difference between the instantaneous pulse voltage and that of the integral capacity becomes positive lags gradually, and the trigger angle also increase gradually. As a result, the average current flowing in the main branch decreases gradually. When the voltage of the integral capacity reaches its maximum value, the diode is reversely biased and the thyristor is also cut off. This is the fading off process.

After the fading on/off processes are completed, the switch enters a on or off stationary state determined by the states of the operational connection points. The holding of these stationary states is the same to that of the a ordinary switch. The speed of the fading on process is determined by RC discharging constant and is inversely proportional to that constant. On the other hand, the speed of switch off fading process is determined by the integral capacitance and charge quantity of the integral pulse, and is proportional to the former, and inversely proportion to the latter.

The branch comprising normally close connection points and resistor is connected between the control and cathode terminal of the thyristor, and this branch has two functions: one is to reduce and normalize the trigger sensitivity of the thyristor so that the manufacture technique and components can be standardized in mass production and capacitors of large capacitance can be choosed as integral capacity to insure the range of time constant of fading on process so that resistor having the resistance beyond the normal series can be avoided, the other to eliminate the unfavourable effects on the fading off time by variation of trigger sensitivity of the thyristor due to the change of ambient temperature and load. By using the combination of single-blade single throw, the potential sensitivity can be fully used and the angle of flow in on stationary state can also be reduced.

Actually, the fading on and off functions provided by the present application is needed in many application fields. When the present application is used in illumination control, the controlled illuminating apparatus can be provided with nature sunlight simulated fading on and off transition characteristics which is adaptative to adjustment machnism of human eyes and make people feel comfortable. Therefore, the present invention can protect human's sight and prolong the life span of the illumination equipments. Once the present application is used in fading on and off reduction on/off control of electrical motor, start current and impulse torque can be reduced, which is helpful to the stabilization of the power network parameters and safety of the equipments. The present invention can also be used in fading on and off reduction on/off control of electrical heating equipment. By using the present invention, the cold state impulse current and thermal stress can be reduced so that the length of life of the equipment can also be prolonged. Since the fading on/off process is automatically controlled and carried out after the on/off guiding operation in the present invention, the complicated on/off transition process adjustment/control apparatus can be partly replaced. Therefore, the cost of some integrated equipment can be reduced. The cost of the present invention is relatively low due to the simple design while the ratio of performance to cost is higher than any substitutive products. Advantageous effects will be obtained when the present invention is widely used.

When the operation button of non hold type is choosen as the operational connection points in the present application, the present invention will become a new type of fading on and off delay switch which can be used in public area like stairs and corridors. Satisfactory results will be obtained when the fading on time and fading off time is set to about 2 s and 2 min, respectively. The lamp controlled by the present invention has the functions of fading on and off, roughly controlling the turn on time and displaying turn off time. Advantageous effects like comfortable and convenient to user, energy saving and prolonging the life of lamp can be achieved when the present application is promoted to be widely used.

The further improvements of the present invention are as follows: a fast discharging synchronic integrater is connected between the anode and cathode of the thyristor, said fast-discharging synchronic integrator consists a resistor sample circuit, a resistor-capacitor integral circuit and a multiple-transistor fast-discharging circuit controlled by the sample circuit. The branch of trigger pulse integrator is connected between the positive side of the integral capacitor of the synchronic integrator and the control terminal of the thyristor. In this improvement, the fast-discharging synchronic integrator, acting as the pulse shifter for trigger branch, provides self adapting magnitude variable sawtooth waveform while the trigger pulse integrator, acting as a dynamic phase variation memory, provides variable trigger reference signal. After being voltage fedback via main branch, the trigger pulse cause the synchronic integrator to fast discharge. Thus, the magnitude envelop of the sawtooth waveform produced by the fast discharging synchronic integrator, in turn, changes monotonously according to the changes of trigger angle, and forms a self adapting magnitude variable signal of sawtooth waveform. When the connection points are closed, the discharge circuit of the trigger pulse integrater is closed, and voltage of the integral capacity decrease gradually. As a result, the instantaneous value of the sawtooth voltage necessary to forwardly bias the diode in trigger pulse integrator branch decrease accordingly, and the integral time of the fast discharging integrator shortens gradually, and its trigger angle decreases gradually. This is fading-on process.

When the connection points are opened, the discharge circuit of the trigger pulse integrator is opened, too. The continuative flow of trigger pulse causes the voltage of integral capacity to increase gradually, and the instantaneous value of the sawtooth voltage necessary to forwardly bias the diode in trigger pulse integrator branch also increase gradually. As a result, the integral time of the fast-discharging is prolonged gradually and trigger angle also increases accordingly. This improvement can enlarge the dynamic range of trigger angle. When the integral time constant of the fast discharging synchronic integrator is set to about 30 ms, the upper limit of the dynamic range of the trigger angle reaches nearly 180°. Therefore, the lower limit of the fading dynamic range of voltage and current in main branch decrease to nearly zero and a excellent control characteristics can be realized.

The solutions used to narrow down the angle of flow in on stationary state as follows: a voltage-regulator diode or light emitting diode branch is added to the fast discharging synchronic integrator, this diode branch is connected between the negative side of the integral capacitor of the fast discharging synchronic integrator and the cathode of the thyristor. The nonlinear characteristic of the voltage-regulator diode or LED inactivate the fast discharging synchronic integrator in on stationary state. Therefore, the synchronic integrator will not exert any shunting effects on trigger current branch. As a result, the instantaneous value of sawtooth wave voltage necessary to forwardly bias the diode in the trigger pulse integrator branch can be reduced, and the angle of triggering can also be reduced. The feature pays an very important role in eliminating electro-magnetic "pollution" and reducing the potential drop across the switch.

BRIEF DESCRIPTION OF THE DRAWING

One preferred embodiment is disclosed in accordance with the drawing wherein,

FIG. 1 is a circuit diagram illustrating a embodiment according to the present application.

DETAILED DESCRIPTION OF THE PREFERRED EMBODIMENTS

Now, a preferred embodiment will be described by reference to the accompanying FIG. 1.

Refer to FIG. 1, diodes D1~D4 form a full-wave bridge circuit. The main current flowing in this bridge circuit is controlled by a thyristor TR. Resistor R1, diodes D5, D6 and capacitor C2 form a trigger pulse integrator which, acting as a dynamic phase variation memory, provides a variable triggering reference signal. Resistors R1 and R2 form a voltage divider sampling circuit, and multiple transistors are provided with a fast discharging synchronic control signal by resistor R2 so as to make the integral capacitor C1 to discharge in time once a operation eycle. Multiple transistors are controllable fast discharging branch of the integral capacitor C1 while R1, D6, C1 and voltage-regulator diode W1 forms a integral circuit. Said voltage divider sampling circuit, fast discharging branch and integral branch form a fast discharging synchronic integrator. In on/off transient process, the integrator produces a self-adapting magnitude-variable sawtooth wave which have a gradually increasing/decreasing envelope. The peak-to-peak voltage of the sawtooth wave is higher than the voltage on the integral capacitor C2. Therefore, diode D5 is biased forwardly, and a pulse flows to trigger the thyristor. After the thyristor is triggered, the voltage across sample resistor R2 decrease to zero, and capacitor C1 is fast discharged, which is the preparation for the next period. The integral time of the fast-discharging synchronic integrator in each period depends on the voltage value on its integral capacitor. The higher the voltage, the longer the integral time, and therefore, the larger the trigger angle, and the smaller the average current of main branch over one period.

Operational connection points are a single pole, double throw switch KS. When the discharging circuit of C2 is closed by KS, the voltage on C2 decrease gradually, trigger angle also decrease gradually. As a result, the average current flowing in the main branch over one period increases gradually until full-open is reached. On the other hand, when the discharging circuit of C2 is opened by switch KS, the voltage on capacitor C2 rise up as pulse charges accumulates on the capacitor, and trigger angle also increase gradually. As a result, the average current flowing in the main branch over one period decrease gradually full-close is reached. The function of R4 is to reduce and normalize the trigger sensitivity of the thyristor during transition process so as to increase the capacitance of C2 and reduce the resistance of resistor R3. The function of capacitor C3 is to make the voltage on capacitor C2 to generate a negative step at the time the switch is just closed, in order to provide the lamp with a practical initial brightness.

In on stationary state, the fast discharging synchnonic integrator is cut-off by voltage-regulator diode W1, and R4 branch is opened by switch KS. This will substantially reduce the one state trigger angle. As a result, the requirements on electric-magnetic compatibility can be met.

The fading on and off switch according to the present invention is particular suitable for the fading on and off control of bedroom lamp, which make the lamp to have fading on and off light intensity simulating the natural sunlight. Therefore, human sight can be protected, and ambient comfortability can be improved. In the present preferred embodiment, the time constant for charging the fast-discharging synchronic integrator $(R_1 \cdot C_1)$ is preferably set to about 30 ms, and the time constant for discharging $(R_2 \cdot C_1/$, wherein is current amplification ratio of the multiple-transistors) is preferably set to 0.1 ms; and the time constant for charging the trigger pulse integrator is preferably set to 20,000 periods (10 ms per period), and the time constant for discharging $((C_2+C_3) \cdot (R_3+R_4))$ is preferably set to about 30 s.

The present invention can be improved by adjusting the above-mentioned parameters according to the specific application and changing or simplifying some additional circuit so as to develop fading on and off switch of different type like bedroom type, delay type, start type and thermal stress eliminating type to be used in nature sunlight-simulated light control in bedrooms, delay-off lamp control in public area, reduction on/off control of motors and thermo-stress eliminating control of electrical heaters, respectively.

I claim:

1. An electronic switch with on/off fading comprising:
    a main circuit including a rectifying bridge circuit and a thyristor,
    a thyristor triggering circuit having a trigger pulse integrator which includes a series branch of a first diode and a first capacitor, said trigger pulse integrator is connected between the anode and the control terminal of the thyristor,
    a control branch formed by a parallel network consisting of a first resistor and a second capacitor connected in parallel,
    a fast—discharging synchronic integrator, connected between the anode and cathode of the thyristor and comprising a sample circuit formed by second and third resistors, a integrating circuit consisting of the second resistor, a second diode, and a third capacitor, and a fast—discharging circuit formed by multiple transistors
    a single pole. double throw switch with two contacts, an on contact connected to the parallel network and an off contact, wherein when said single pole, double throw switch is connected to the off contact, the control and cathode of the thyristor are serially connected with a fourth resistor, and
    wherein one side of the first capacitor of the trigger pulse integrator is connected to the control terminal of the thyristor and wherein said series branch is connected between the positive side of the third capacitor in the synchronic integrator and the control terminal of the thyristor.

2. An electronic switch with on/off fading according to claim 1, wherein a voltage-regulator diode or LED branch is added to said fast—discharging synchronic integrator, and said voltage-regulator diode or LED branch is connected serially between the negative side of the third capacitor and the cathode of the thyristor.

3. An electronic switch on/off fading, comprising:
    a main circuit including a rectifying bridge circuit and a thyristor,
    a thyristor triggering circuit having a trigger pulse integrator which includes a series branch of a first diode and a first capacitor, said trigger pulse integrator is connected between the anode and the control terminal of the thyristor,
    a control branch formed by a discharging resistor;
    a fast—discharging synchronic integrator, connected between the anode and cathode of the thyristor and comprising a sample circuit formed by first and second resistors, an integrating circuit consisting of the first resistor, a second diode and a second capacitor and a fast—discharging circuit formed by multiple transistors,
    a single pole, double throw switch with two contacts, the first contact electrically connected with said discharge resistor and the other contact electrically connected such that when the single pole, double throw switch contacts the other contact, the control and cathode of the thyristor are serially connected through a third resistor, wherein one side of the first capacitor of the trigger pulse integrator is connected to the control terminal of the thyristor.

4. An electronic switch with on/off fading according to claim 3, wherein said second diode and said second capacitor are a part of said trigger pulse integrator.

5. An electronic switch with on/off fading according to claim 3, wherein said discharging resistor in said control branch is connected in parallel with a third capacitor.

6. An electronic switch with on/off fading according to claim 3, wherein said series branch of said first diode and first capacitor is connected between the positive side of the second capacitor and the control terminal of the thyristor.

7. An electronic switch with on/off fading according to claim 3, wherein a voltage regulator diode or LED branch is added to said fast discharging synchronic integrator, and said voltage regulator diode or LED branch is connected serially between the negative side of the second capacitor and the cathode of the thyristor.

* * * * *